United States Patent
Huang et al.

(10) Patent No.: US 7,368,809 B2
(45) Date of Patent: May 6, 2008

(54) PILLAR GRID ARRAY PACKAGE

(75) Inventors: Hsiang-Ming Huang, Tainan (TW); Yeong-Ching Chao, Tainan (TW); Yi-Chang Lee, Tainan (TW); An-Hong Liu, Tainan (TW)

(73) Assignees: ChipMOS Technologies (Bermuda) Ltd., Hamilton HM 12 (BM); ChipMOS Technologies Inc., Hsinchu (TW)

( * ) Notice: Subject to any disclaimer, the term of this patent is extended or adjusted under 35 U.S.C. 154(b) by 143 days.

(21) Appl. No.: 11/228,234

(22) Filed: Sep. 19, 2005

(65) Prior Publication Data

US 2006/0231941 A1    Oct. 19, 2006

(30) Foreign Application Priority Data

Apr. 14, 2005   (TW) .............................. 94111881 A

(51) Int. Cl.
 *H01L 23/02*   (2006.01)
 *H01L 21/44*   (2006.01)
(52) U.S. Cl. .................. 257/678; 257/690; 257/777; 257/787; 257/E23.001; 438/107; 438/126; 438/127

(58) Field of Classification Search ................ 257/678, 257/690, 684, 777, 787; 438/107, 126, 127
See application file for complete search history.

(56) References Cited

U.S. PATENT DOCUMENTS

| | | | |
|---|---|---|---|
| 6,335,271 B1 * | 1/2002 | Fukuyama .................. 438/616 |
| 6,602,733 B2 * | 8/2003 | Iwahashi et al. ............ 438/108 |
| 2002/0053730 A1 * | 5/2002 | Mashino ..................... 257/690 |
| 2003/0116866 A1 * | 6/2003 | Cher 'Khng et al. ........ 257/780 |

* cited by examiner

*Primary Examiner*—Hsien-Ming Lee
(74) *Attorney, Agent, or Firm*—Troxell Law Office, PLLC

(57) ABSTRACT

A pillar grid array package (PGA) includes a substrate, a chip disposed on top of the substrate, and a plurality of stud bumps disposed on bottom of the substrate. The stud bumps are formed in an array and each has a flattened top to electrically connect to a printed circuit board, PCB, by an anisotropic conductive paste to achieve a thin package and to avoid substrate warpage problems of a ball grid array (BGA) during high-temperature reflow processes.

7 Claims, 2 Drawing Sheets

PILLAR GRID ARRAY PACKAGE

FIELD OF THE INVENTION

The present invention relates to an IC package, and more particularly, to an IC package with pillar grid array (PGA) configuration.

BACKGROUND OF THE INVENTION

The well-known ball grid array package (BGA) is to place solder balls on a substrate in an array for mounting on a printed circuit board (PCB) by surface mount technology, SMT, to achieve the maximum pin counts within the minimum footprint.

As shown in FIG. 1, a conventional BGA package 100 includes a substrate 110, a chip 120 and a plurality of solder balls 140. The chip 120 is disposed on the top surface 111 of the substrate 110 wherein the chip 120 is a bumped chip with a plurality of bumps 122 disposed on the active surface 121 of the chip 120. Then the chip 120 is flipped and electrically connected to the substrate 110 by means of the bumps 122. A plurality of solder balls 140 arranging in an array are disposed on the bottom surface 112 of the substrate 110 to electrically connect to the SMT surface 11 of the PCB 10. Normally, an underfill 130 is disposed between the chip 120 and the substrate 110 to encapsulate the bumps 122.

When the BGA package 100 is attached to the PCB 10 by SMT, in order to electrically connect the solder balls 140 to the connecting pads of the PCB, a high-temperature reflow process is necessary. However, during the reflow process, the substrate 110 can be easily warpaged due to the high reflowing temperature. Normally, the maximum stress is concentrated on parts of the solder balls 140 close to the edges of the substrate 110. The solder balls 140 can be easily broken leading to electrically open. In order to increase the bonding strength of the solder balls 140, larger solder balls are preferred but will easily cause bridging during SMT processes.

SUMMARY OF THE INVENTION

The main purpose of the present invention is to provide a pillar grid array package (PGA). A plurality of stud bumps formed by wiring-bonding are disposed in an array on the bottom surface of a substrate wherein each stud bump has a flattened top exposed for electrically connecting to the connecting pads of a PCB by anisotropic conductive paste (ACP), anisotropic conductive film (ACF), or ultra-sonic bonding without high-temperature reflow processes to eliminate substrate warpages, moreover, to achieve thinner IC packages.

The second purpose of the present invention is to provide a pillar grid array package wherein a plurality of stud bumps are disposed under a substrate and each has a flattened top with good coplanarity to electrically connect to a PCB. Preferably, these stud bumps have curved sidewalls to reduce lateral bridging.

According to the present invention, a pillar grid array package mainly includes a substrate, a chip and a plurality of stud bumps wherein the substrate has a top surface and a bottom surface. The chip is disposed on the top surface of the substrate. The stud bumps are disposed on the bottom surface of the substrate in an array wherein each stud bump has a flattened top exposed to replace the solder balls of conventional BGA packages to eliminate the conventional high temperature reflow processes.

DETAIL DESCRIPTION OF THE INVENTION

Please refer to the attached drawings, the present invention will be described by means of embodiment(s) below.

Figure 1:
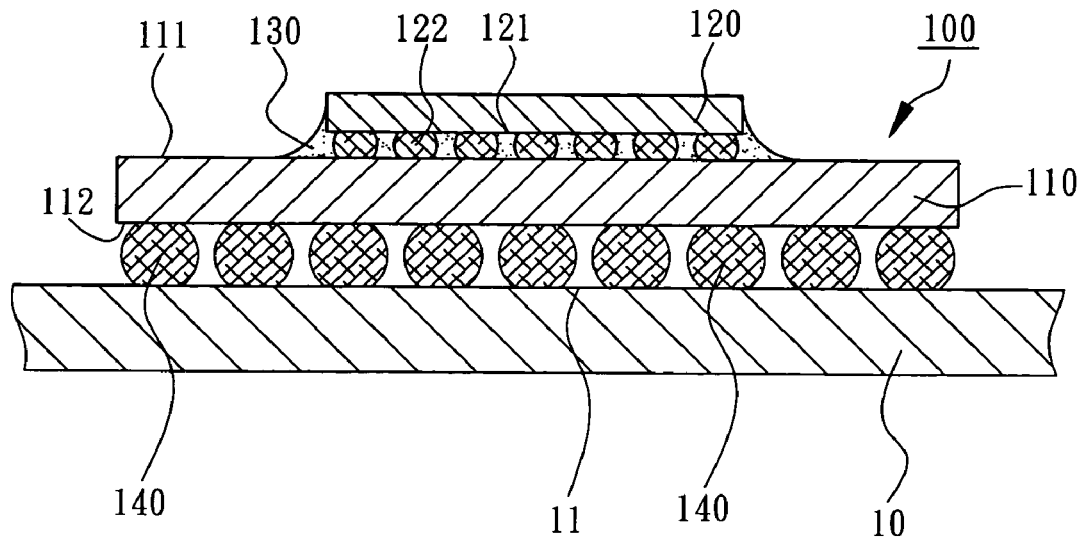
FIG. 1 is a cross-sectional view of a conventional BGA package.
Figure 2:
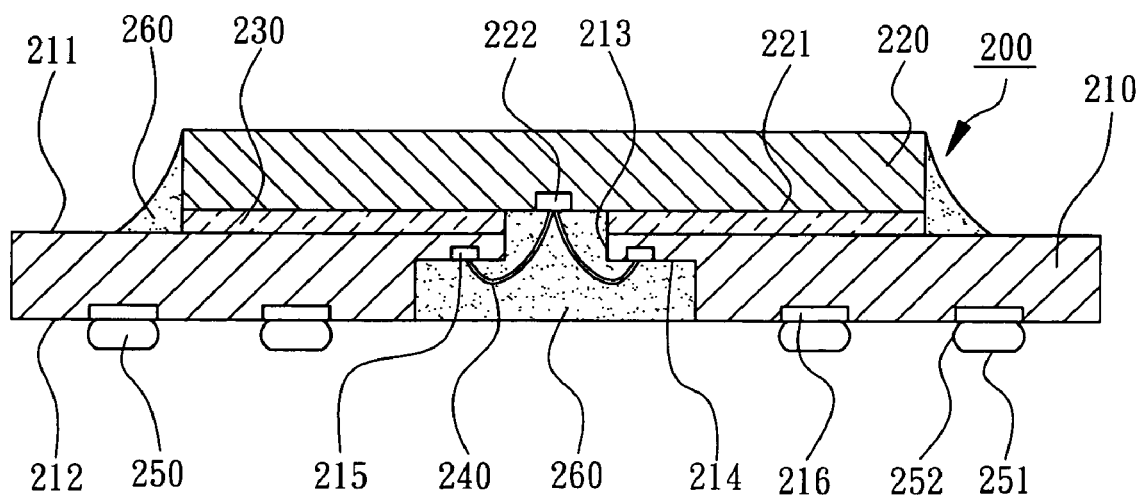
FIG. 2 is a cross-sectional view of a Pillar Grid Array (PGA) package according to the first embodiment of the present invention.

In the first embodiment according to the present invention, as shown in FIG. 2, a PGA (Pillar Grid Array) package 200 mainly includes a substrate 210, a chip 220, and a plurality of stud bumps 250. The substrate 210 has a top surface 211 and a bottom surface 212. In this embodiment, the substrate 210 further has a slot 214 for exposing the bonding pads 222 of the chip 220 and has a plurality of inner bonding fingers 215 around the slot 214. Preferably, the slot 213 has a multi-tier structure where the inner bonding fingers 215 are disposed on the multi-tier structure to reduce the loop height of a plurality of bonding wires 240 to further reduce the thickness of the encapsulant 260. Furthermore, a plurality of outer bonding pads 216 are disposed on the bottom surface 212 of the substrate 210 for bonding the stud bumps 250.

Please refer to FIG. 2 again. The chip 220 is disposed on the top surface 211 of the substrate 210 by a die-attach adhesive material 230 to attach the active surface 221 of the chip 220 to the top surface 211 of the substrate 210. In the embodiment of the present invention, a plurality of bonding pads 222 on the active surface 221 of the chip 220 are exposed from the slot 213 where the bonding pads 222 of the chip 220 are electrically connected to the inner fingers 215 of the substrate 210 by a plurality of bonding wires 240 through the slot 213.

Furthermore, a plurality of stud bumps 250 are disposed in an array on the bottom surface 212 of the substrate 210 where the stud bumps 250 are bonded to the outer bonding pads 216 to be outer electrical connectors of a PGA package to replace the solder balls of a BGA package. The stud bumps 250 are formed by wire bonding which may contain gold, copper, aluminum, or other metals. Moreover, every stud bump 250 has a flattened top 251 exposed which is formed by means of polishing, cutting or etching as pillar bumps to provide a good bonding surface for ACP (anisotropic conductive paste), ACF (anisotropic conductive film) or ultra-sonic eutectic bonding. Preferably, the flattened tops 251 are coplanar to achieve good ACP electrical connection.

Moreover, an encapsulant 160 is formed inside the slot 213 to encapsulate the bonding wires 240, bonding pads 222 and the inner fingers 215. Since the loop height of the bonding wires 240 are lower, therefore, the encapsulant 260 will not protrude from the bottom surface 212 of the substrate 210. In the present embodiment, the encapsulant 260 further encapsulates the sides of the chip 220.

Figure 3:
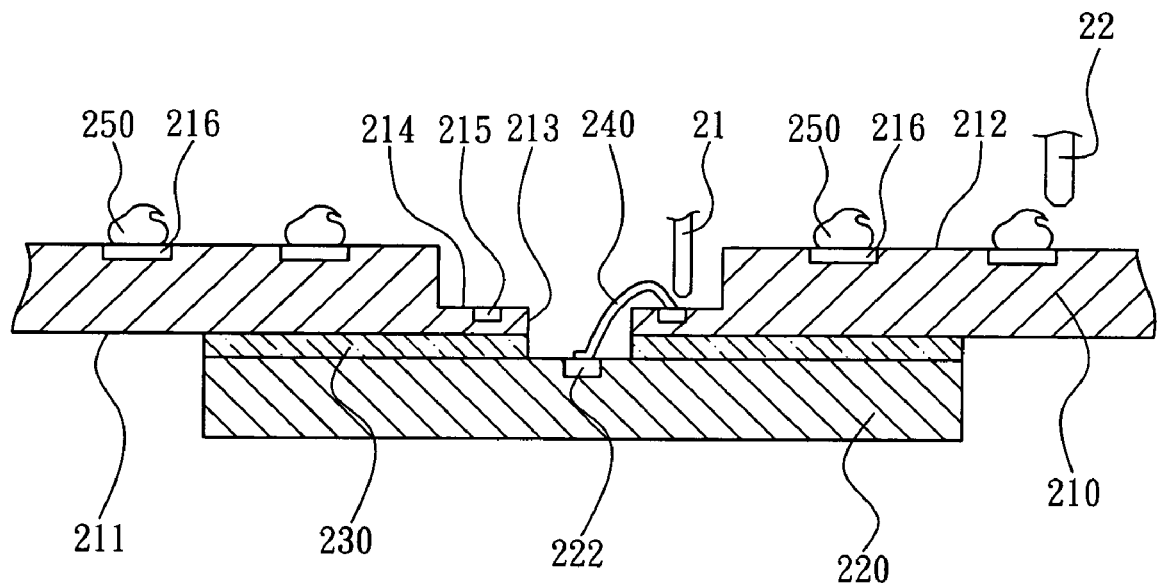
FIG. 3 is the cross-sectional view of the PGA package during wire bonding and stud bond forming processes according to the first embodiment of the present invention.

Since the bonding wires 240 and the stud bumps 250 are formed by wire bonding, please refer to FIG. 3, a smaller capillary tool 21 is used to form the bonding wires 240, and a larger capillary tool 22 with gold (Au) wires to form the stud bumps 250 during a same wire bonding process. Then after encapsulating, the substrate 210 is processed by a flattening machine, not shown in the figure, to form the exposed flattened tops 251 of the stud bumps 250 with good coplanarity. The conventional solder ball placement can be eliminated to simplify the overall packaging processes. The stud bumps 250 formed by wire bonding have curved sidewalls 252 which are different from the conventional pillar bumps to reduce the lateral bridging.

Therefore, the PGA 200 can be mounted on a PCB by SMT, not shown in the figure, by ACP or ultra-sonic bonding to form a thin electronic device. The high-temperature reflow processes can be eliminated during SMT processes to eliminate the warpage of the substrate 210 and the breaks of the stud bumps 250.

Figure 4:
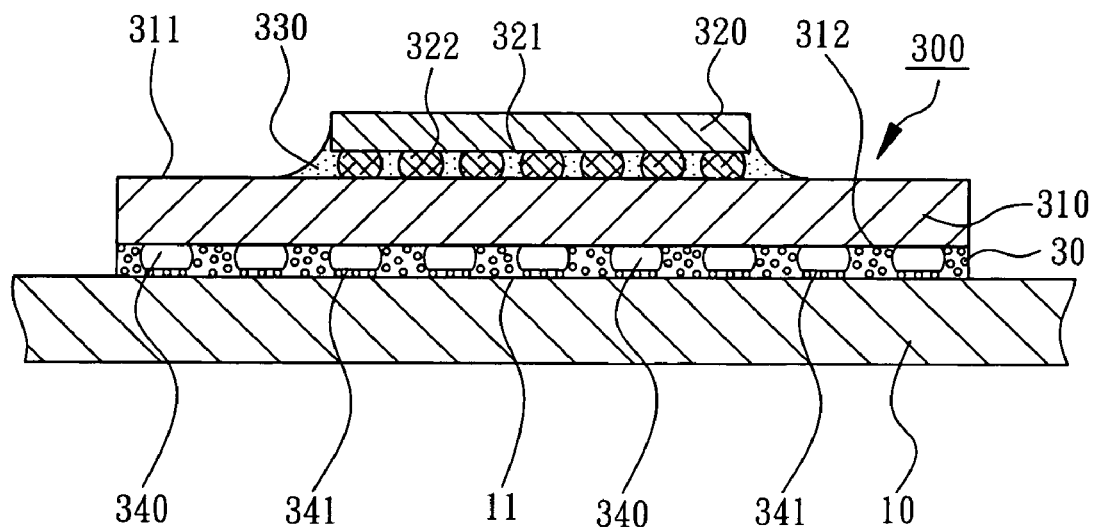
FIG. 4 is another PGA package according to the second embodiment of the present invention.

According to the second embodiment of the present invention, as shown in FIG. 4, a PGA package 300 can be mounted on the SMT surface 11 of a PCB 10 by a ACP 30 (anisotropic conductive paste) or ACF (anisotropic conductive film) to form a thin electronic device. The PGA package 300 includes a substrate 310, a chip 320, and a plurality of stud bumps 340 where the substrate 310 is a rigid or flex PCB having a top surface 311 and a bottom surface 312. The chip 320 is disposed on the top surface 311 of the substrate 310. In the present embodiment, the chip 320 is a bumped chip which has a plurality of bumps 322 on its active surface 321. The bumps 322 are formed on the active surface 321 of the chip 320. Then the chip 320 is flipped to electrically connect to the top surface 322 of the substrate 310 by the bumps 322. An underfill 330 or other encapsulant is disposed between the top surface 311 of the substrate 310 and the active surface 321 of the chip 320 to encapsulate the bumps 322.

A plurality of stud bumps 340 are disposed on the bottom surface 322 of the substrate 310 in an array where each stud bump 340 has a flattened top 341 exposed. Preferably, the flattened tops 341 are coplanar so that the conductive particles with the same dimensions from ACP 30 can establish electrical connections between the flattened tops 341 and connecting pads on the SMT surface 11 of the PCB 10. If the substrate 310 is flexible, the coplanarity of the flattened top 341 is not critical to easily provide electrical connection between the PGA package 300 and the PCB 10.

The above description of embodiments of this invention is intended to be illustrative and not limiting. Other embodiments of this invention will be obvious to those skilled in the art in view of the above disclosure.

What is claimed is:

1. A pillar grid array package comprising:
   a substrate having a top surface and a bottom surface;
   a chip disposed on the top surface of the substrate; and
   a plurality of stud bumps formed by wire-bonding and disposed on the bottom surface of the substrate in an array, wherein each stud bump has a flattened top exposed;
   wherein the chip has an active surface attached to the top surface, the substrate has a slot to expose a plurality of bonding pads on the active surface of the chip, and a plurality of inner fingers disposed around the slot.

2. The package of claim 1, wherein the flattened tops of the stud bumps are coplanar.

3. The package of claim 1, wherein the slot of the substrate has a multi-tier structure and the plurality of inner fingers disposed on the multi-tier structure.

4. The package of claim 1, further comprising a plurality of bonding wires electrically connecting the bonding pads of the chip to the inner fingers of the substrate through the slot.

5. The package of claim 4, further comprising an encapsulant disposed inside the slot to encapsulate the bonding wires, the bonding pads, and the inner fingers.

6. The package of claim 5, wherein the encapsulant further encapsulates the sides of the chip.

7. The package of claim 1, wherein the stud bumps have curved sidewalls.

* * * * *